United States Patent [19]
Song

[11] Patent Number: 6,118,396
[45] Date of Patent: Sep. 12, 2000

[54] OPTICALLY SAMPLING, DEMULTIPLEXING, AND A/D CONVERTING SYSTEM WITH IMPROVED SPEED

[75] Inventor: William S. Song, Lexington, Mass.

[73] Assignee: Massachusetts Institute of Technology, Cambridge, Mass.

[21] Appl. No.: 08/998,304

[22] Filed: Dec. 24, 1997

[51] Int. Cl.[7] .................................................. G02F 7/00
[52] U.S. Cl. ................................... 341/137; 250/222.14
[58] Field of Search ...................... 341/137; 250/222.14

[56] References Cited

U.S. PATENT DOCUMENTS

| | | | |
|---|---|---|---|
| H353 | 10/1987 | Taylor | 340/347 AD |
| 4,033,882 | 7/1977 | Fletcher et al. | 250/199 |
| 4,325,603 | 4/1982 | Marom | 341/137 |
| 4,325,635 | 4/1982 | Sattler et al. | 356/349 |
| 4,390,247 | 6/1983 | Freyre | 350/358 |
| 4,446,425 | 5/1984 | Valdmanis et al. | 324/77 K |
| 4,448,494 | 5/1984 | Freyre | 350/358 |
| 4,460,250 | 7/1984 | Freyre et al. | 350/358 |
| 4,743,110 | 5/1988 | Arnaud et al. | 356/5 |
| 4,906,069 | 3/1990 | Brandstetter et al. | 350/162.12 |
| 5,003,626 | 3/1991 | Kuwahara et al. | 455/619 |
| 5,010,346 | 4/1991 | Hamilton et al. | 341/137 |
| 5,017,793 | 5/1991 | Halsey et al. | 250/551 |
| 5,121,241 | 6/1992 | Veith | 359/152 |
| 5,146,075 | 9/1992 | Kim et al. | 250/211 |
| 5,155,352 | 10/1992 | Kim et al. | 250/211 |
| 5,176,854 | 1/1993 | Ito et al. | 252/582 |
| 5,233,582 | 8/1993 | Tanno et al. | 369/44.23 |
| 5,247,388 | 9/1993 | Anderson et al. | 359/287 |
| 5,249,072 | 9/1993 | Ichimura et al. | 359/191 |
| 5,262,836 | 11/1993 | Nourrcier | 356/5 |
| 5,267,011 | 11/1993 | Callender | 356/5 |
| 5,280,168 | 1/1994 | Kim et al. | 250/214 |
| 5,289,252 | 2/1994 | Nourrcier | 356/5 |
| 5,304,805 | 4/1994 | Brown et al. | 250/338.1 |
| 5,307,073 | 4/1994 | Riza | 342/372 |
| 5,381,147 | 1/1995 | Birkmayer | 341/137 |
| 5,548,433 | 8/1996 | Smith | 359/158 |
| 5,625,727 | 4/1997 | Liedenbaum et al. | 385/16 |

FOREIGN PATENT DOCUMENTS

| | | | |
|---|---|---|---|
| 61-282826 | 12/1986 | Japan | G02F 7/00 |
| 14100270 | 7/1988 | Russian Federation . | |
| 2245715A | 1/1992 | United Kingdom | G02F 1/35 |

OTHER PUBLICATIONS

Yariv et al., *Time interleaved optical sampling for ultra high speed A/D conversion*, Electronics Letters vol. 34 No. 21, Oct. 15, 1998, pp. 2012–2013.

Taylor et al., High–Speed Electro–Optic Analog–to–Digital Converter:Technical Report 351 of Naval Ocean Systems Center, San Diego, CA 1978, pp. 1–18.

D.H. Auston et al., "Picosecond Optoelectronic Detection, Sampling, and Correlation Measurements in Amorphous Semiconductors" *Appl. Phys. Lett.* 37(4):371–373 (1980); Aug. 1980.

(List continued on next page.)

*Primary Examiner*—Howard L. Williams
*Attorney, Agent, or Firm*—Testa, Hurwitz & Thibeault, LLP

[57] ABSTRACT

An ultra-fast electrooptic analog-to-digital converter is described. The A/D converter includes an electrooptic modulator that generates a modulated light beam from an incident light beam in response to an applied modulation signal. An optical demultiplexer is positioned to receive the modulated light beam. The optical input of a respective one of a plurality of photodetectors is optically coupled to a respective one of a plurality of demultiplexed modulated light beams. Each of the plurality of photodetectors generates an electrical signal in response to an intensity of the demultiplexed modulated light beam that is coupled to its optical input. A plurality of charge comparators compares electrical signals generated in response to the intensities of the demultiplexed modulated light beam to a reference signal. The output of each of the plurality of charge comparators generates a digital representation of the incident light beam.

20 Claims, 2 Drawing Sheets

OTHER PUBLICATIONS

J.A. Bell et al., "Extension of Electronic A/D Converters to Multi–Gigahertz Sampling Rates Using Optical Sampling and Demultiplexing Techniques" Asilomar Conference on Signals, Systems and Computers (Oct. 1989).

J.A. Bell et al., "A/D Conversion of Microwave Signals Using a Hybrid Optical/Electronic Technique" *SPIE* *1476*:326–329 (1991).

D.M. Bloom, "Subpicosecond Electrooptic Sampling" Interim Report to the Air Force Office of Scientific Research of a Program of Research in Subpicosecond Electrooptic Sampling, Contract # F49620–92–J–0099, Edward L. Ginzton Lab., W.W. Hansen Labs. of Physics of Stanford Univeristy, Stanford, CA (1993).

A.G. Foyt et al., "Picosecond InP Optoelectronic Switches" *Appl. Phys. Lett.* *40*(6):447–449 (1982).

L. Goldberg et al., "Generation and Control of Mirowave Signals by Optical Techniques" *IEEE Proceed. J.* *139*(4):288–295 (1992).

R.J. Helkey et al., "Millimeter–Wave Signal Generation Using Semiconductor Diode Lasers" *Micro. & Optical Tech. Lett.* *6*(1):1–5 (1993).

R. Hofmann et al., "Electro–Optic Sampling System for the Testing of High–Speed Integrated Circuits Using a Free Running Solid–State Laser" *J. of Lightwave Tech.* *14*(8):1788–1793 (1996).

D.C. Ni et al., "Use of Picosecond Optical Pulses and FET's Integrated with Printed Circuit Antennas to Generate Millimeter Wave Radiation" *IEEE Photonics Tech. Lett.* *3*(3):273–275 (1991).

D. Novak et al., "Millimetre–Wave Signal Generation Using Pulsed Semiconductor Lasers" *Electronics Letters* *30*(17):1430–1431 (1994).

D. Novak et al., "Signal Generation Using Pulsed Semiconductor Lasers for Application in Millimeter–Wave Wireless Links" *IEEE Trans. on Microwave Theory & Techniques* *43*(9):2257–2262 (1995).

H. Ogawa, "Application of Optical Techniques to Microwave Signal Processing (MSP)—Optical–Microwave Signal Processing" *IEEE Trans. Electron.* *E79*(1):87–97 (1996).

K. Takeuchi et al., "High–Speed Optical Sampling Measurement of Electrical Wave Form Using a Scanning Tunneling Microscope" *Appl. Phys. Lett.* *63*(26):3548–3549 (1993).

H. F. Taylor, "An Electrooptic Analog–to–Digital Converter" *Proc. of IEEE*, pp 1524–1525 (1975).

H.F. Taylor, "An Optical Analog–to–Digital Converter Design and Analysis." *IEEE J. Quantum Electronics* *QE–15*(4)(1979).

H.F. Taylor, "Extended Precision in Video–Bandwidth Analogue/Digital Convertors Using Optical Techniques", *Electronics Letters* *20*(8):352–353 (1984).

M.J. Taylor et al., "High–Speed Electro–Optic Analog–to–Digital Converter" Technical Report 351 of Naval Ocean Systems Center, San Diego, CA (1978); Odd Numbered Pages.

J.R. Teague et al., "Advanced Modulator II" Technical Report AFAL–TR–74–17 of McDonnell Douglas Astronautics Company—East and McDonnell Douglas Corporation, St. Louis, MO (1974).

International Search Report dated May 04, 1999 in corresponding application PCT/US98/26964.

OPTICALLY SAMPLING, DEMULTIPLEXING, AND A/D CONVERTING SYSTEM WITH IMPROVED SPEED

GOVERNMENT SUPPORT

This invention was made with government support under Contract Number 19628-95-C-0002 awarded by the Air Force. The government has certain rights in the invention.

FIELD OF THE INVENTION

The invention relates generally to the field of analog-to-digital conversion of electrical signals. In particular, the invention relates to an apparatus and a method for ultra-fast electrooptical analog-to-digital conversion.

BACKGROUND OF THE INVENTION

Analog-to-digital (A/D) converters are used to convert real world continuously varying analog signals to digital data for use by digital systems that process, store, interpret, and manipulate digital data. Some applications, such as radar signal processing, communications, and instrumentation, require analog-to-digital conversion at rates exceeding that of electronic A/D converters. For these applications, electrooptic devices typically are used to perform analog-to-digital conversion.

One approach to high-speed analog-to-digital conversion uses an electrooptical modulator for optical sampling. See H. F. Taylor, "An Electrooptic Analog-to-Digital Converter, Proceedings of the IEEE, Volume 63, Pages 1524–1525, 1975. Taylor's electrooptic A/D converter uses an electrooptic modulator with an output intensity that has a periodic dependence on the voltage applied to its modulation input. The output of the modulator is captured by a photodetector and compared to a threshold signal. The result of the comparison is a digital output that represents a one bit analog-to-digital conversion of the analog voltage applied to the modulation input.

Taylor also discloses a multibit A/D converter that uses multiple modulators where the ratio of the output intensity to the input voltage of each modulator is progressively scaled by a factor of two. The speed of Taylor's electrooptic A/D converter is, however, limited by the speed of the electronic amplifiers that amplify the signals generated by the photodiodes and the speed of the electronic comparators that compare the modulator outputs to the threshold signal. Taylor's electrooptic A/D converter also requires the use of electrooptic modulators that have precise predetermined gain.

U.S. Pat. No. 5,010,346 describes another approach to high-speed analog-to-digital conversion that uses a time-demultiplexing architecture. The device uses electrooptic modulators to generate modulated light beams from an input pulsed light beam and from an input analog signal. An optical demultiplexer is used to demultiplex the modulated light beam to multiple paths to reduce the pulse repetition rate. A photodetector is coupled to each of the outputs of the demultiplexer to convert the demultiplexed modulated light beams into packets of charge. Electronic A/D converters are used to quantize the charge packets thereby producing a digital signal.

The A/D converter described in U.S. Pat. No. 5,010,346 requires the use of a large number of electronic A/D converters to achieve high-speed analog-to-digital conversion. Using a large number of electronic A/D converters may not be desirable because electronic A/D converters are relatively large and complex devices that are relatively expensive and difficult to manufacture. In addition, the A/D converter described in U.S. Pat. No. 5,010,346 requires the use of a pulsed laser.

There exists a need for a high-speed A/D converter that is not limited by the speed of the electronic devices such as amplifiers and comparators and that does not require the use of a large number of electronic A/D converters.

SUMMARY OF THE INVENTION

It is, therefore, a principal object of this invention to provide an ultra-fast electrooptical A/D converter that does not require electrical quantization and that is relatively simple and inexpensive to manufacture. It is another object of this invention to provide an ultra-fast electrooptical A/D converter that allows the use of nonlinear optical modulators with imprecise gain. It is yet another object of this invention to provide an ultra-fast electrooptical A/D converter that allows the use of a CW laser.

A principal discovery of the present invention is that an ultra-fast electrooptical A/D converter can be constructed using an optical demultiplexer and a charge comparators. It is another principal discovery of the present invention that an ultra-fast electrooptical A/D converter can be constructed using nonlinear optical modulators and an electronic error correction circuit coupled to the digital output of the A/D converter. It is yet another principal discovery of the present invention that an ultra-fast electrooptical A/D converter can be constructed using nonlinear optical modulators that include electronic gain at the modulation inputs.

Accordingly, the present invention features an A/D converter that includes an electrooptic modulator having an optical input adapted to receive an incident light beam and an electrical modulation input. The incident light beam may be continuous wave laser light or pulsed laser light. The electrooptic modulator generates a modulated light beam from the incident light beam in response to a modulation signal that is applied to the electrical modulation input. The intensity of the modulated light beam is a periodic function of the modulation signal.

The A/D converter may also include an optical demultiplexer that includes an optical input that is positioned to receive the modulated light beam. The optical demultiplexer generates a plurality of demultiplexed modulated light beams. The demultiplexing rate of the optical demultiplexer may be substantially equal to the repetition rate of the pulsed light beam.

The A/D converter also includes a plurality of photodetectors. The optical input of a respective one of the plurality of photodetectors is optically coupled to a respective one of the plurality of demultiplexed modulated light beams. Each of the plurality of photodetectors generates an electrical signal at its electrical output in response to an intensity of the demultiplexed modulated light beam that is coupled to its optical input.

In addition, the A/D converter includes a plurality of charge comparators. The charge comparator may include a charge-to-voltage converter such as a parallel combination of a capacitance and a switch. The charge-to-voltage converter may also include a parallel combination of a transimpedance amplifier and a switch.

Each charge comparator includes a first input and a second input. The first input of each charge comparator is electrically coupled to a threshold signal source. The first input of each charge comparator may be coupled to the same threshold signal source. Alternatively, the first input of each charge comparator may be coupled to a different threshold signal source. Applying different threshold signals to some or all of the plurality of charge comparators may be used to compensate for nonlinearities or other errors in the A/D converter.

The second input of each of a respective one of the plurality of charge comparators is electrically coupled to the electrical output of each of a respective one of the plurality of photodetectors. The output of each of the plurality of charge comparators produces a one bit digital representation of the incident light beam.

The A/D converter may include a digital error correcting circuit that is electrically coupled to the output of each of the plurality of charge comparators. The error correcting circuit corrects for erroneous charge comparator outputs. The error correcting circuit may poll the outputs of each charge comparator to determine the correct digital representation of the incident light beam. The error correcting circuit may use a look-up table to determine the correct digital representation of the incident light beam.

The A/D converter may also include an encoding circuit that is electrically coupled to the output of each of the plurality of charge comparators. The encoding circuit transforms the digital representation of the incident light beam into one of numerous digital codes.

The present invention also features a multibit A/D converter that includes two or more electrooptic modulators. Each modulator has an optical input adapted to receive an incident light beam and an electrical modulation input. The incident light beam may be substantially the same incident light beam for each of the two or more electrooptic modulators.

Each of the two or more electrooptic modulators generate a modulated light beam from an incident light beam in response to a modulation signal applied to the electrical modulation input. Each of the two or more electrooptic modulators may have a gain that is successively increased by substantially a factor of two so that the output intensity of each of the two or more electrooptic modulators is successively increased by substantially a factor of two.

The multibit A/D converter may also include two or more amplifiers where a respective one of the two or more amplifiers is coupled to a respective one of the electrical modulation inputs of the two or more electrooptic modulators. Each of the two or more amplifiers provide an amplified electrical modulation signal having a predetermined gain. The predetermined gain of each of the two or more amplifiers may be substantially different from the predetermined gain of each of the other two or more amplifiers by a factor of two.

The multibit A/D converter may also include two or more optical demultiplexers that are positioned to receive a modulated light beam from a respective one of the two or more electrooptic modulators. Each of the two or more optical demultiplexers generates a plurality of demultiplexed modulated light beams. The plurality of demultiplexed modulated light beams are generated at a predetermined demultiplexing rate that may be controlled by the repetition rate of the laser generating the incident light beam.

The multibit A/D converter also includes a plurality of photodetectors that are positioned such that the optical input of a respective one of the plurality of photodetectors is optically coupled to a respective one of the plurality of demultiplexed modulated light beams. Each of the plurality of photodetectors generates an electrical signal at its electrical output in response to an intensity of the demultiplexed modulated light beam that is coupled to its optical input.

The multibit A/D converter also includes a plurality of charge comparators. Each charge comparator includes a first input and a second input. The first input is electrically coupled to a threshold signal source. The first input of each charge comparator may be coupled to the same threshold signal source so that substantially the same threshold signal is applied to the first input of each of the plurality of charge comparators. Alternatively, the first input of each charge comparator may be coupled to different threshold signal sources so that different threshold signals are applied to the first input of each of the plurality of charge comparators.

The second input of each of a respective one of the plurality of charge comparators is electrically coupled to the electrical output of each of a respective one of the plurality of photodetectors. The plurality of charge comparators generates a digital representation of the incident light beam.

BRIEF DESCRIPTION OF THE DRAWINGS

This invention is described with particularity in the appended claims. The above and further advantages of this invention may be better understood by referring to the following description taken in conjunction with the accompanying drawings, in which:

DETAILED DESCRIPTION

Figure 1:
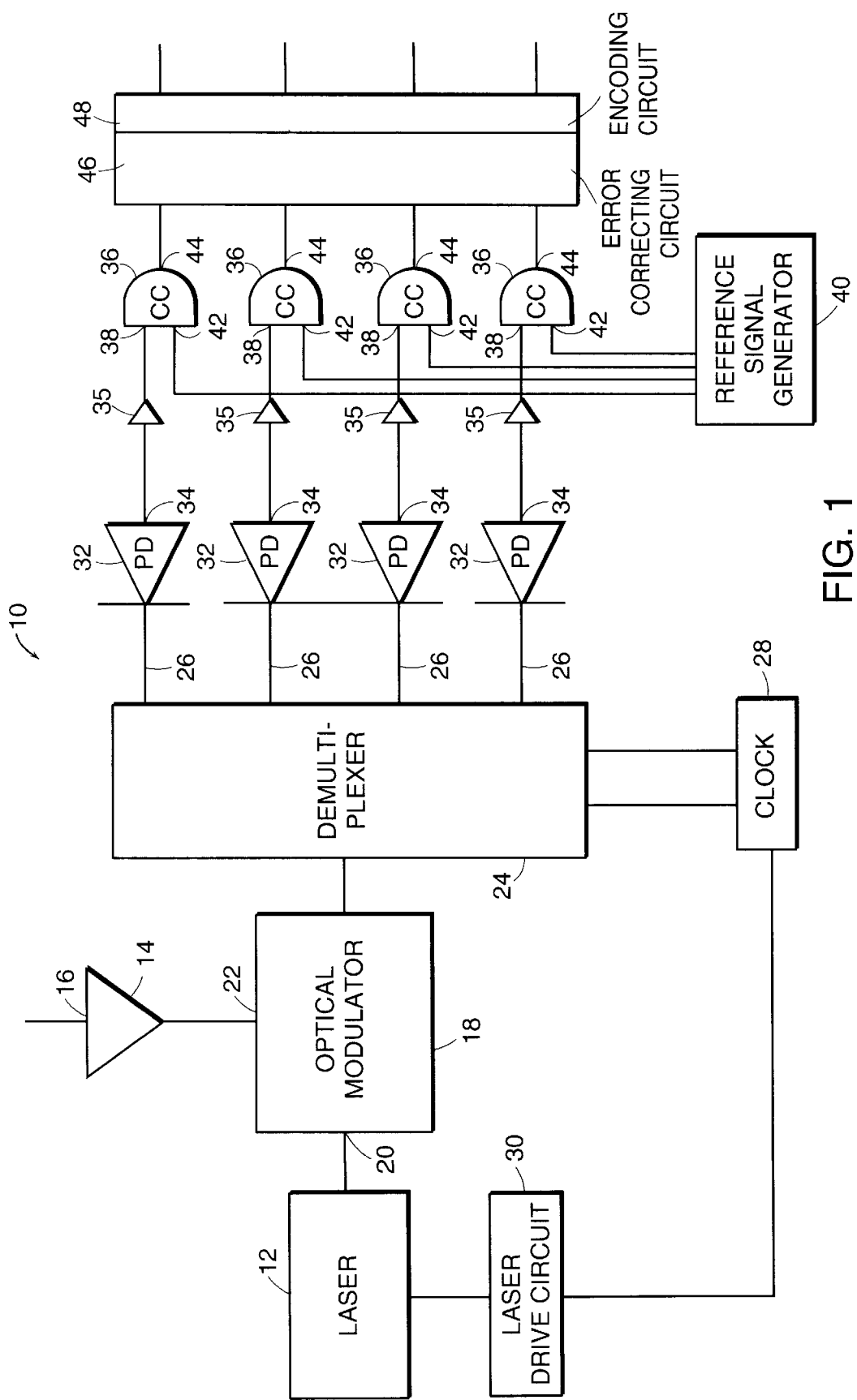
FIG. 1 is a one bit ultra-fast electrooptical analog-to-digital converter embodying the invention.

FIG. 1 is a one bit ultra-fast electrooptical analog-to-digital converter 10 embodying the invention. A laser 12 generates a CW or a pulsed beam of light. The laser 12 may be a mode-locked diode laser that generates a pulsed beam of light having a predetermined repetition rate. An electronic amplifier 14 provides gain to an analog electronic modulation signal that is applied to an input 16 of the amplifier 14.

An optical modulator 18 receives the beam of light at a signal input 20 and receives the amplified electrical modulation signal at a modulation input 22. The modulator 18 intensity modulates the light beam with the modulation signal. If the light beam is a pulsed light beam, then the optical modulation signal is sampled at the repetition rate of the laser 12. The output of the optical modulator varies periodically as a function of voltage applied to the modulation input 22.

A demultiplexer 24 may be used to receive the sampled light beam and demultiplexes it into N channels 26 of light beams. FIG. 1 illustrates four channels. The demultiplexer 24 is controlled by a clock 28 that may operate synchronously with the laser 12. The clock 28 may be derived from a laser drive circuit 30. The demultiplexer 24 directs each pulse generated by the laser 12 to a particular channel 26 selected from the N channels. The repetition rate of the demultiplexed pulses is 1/N of the repetition rate of the laser 12. Thus, the demultiplexer 24 reduces the repetition rate of the pulses by a factor of 1/N. In operation, the repetition rate of the demultiplexed pulses is chosen such that available electronic devices can be used to process the pulses.

One of a plurality of photodetectors 32 is optically coupled to each of the N channels of the demultiplexer 24. Each of the respective photodetectors 32 generates an electrical signal at an electrical output 34 that is proportional to the amplitude of the demultiplexed optical pulses. In one embodiment, the laser 12 is a CW laser and an amplifier 35 is electrically coupled to each of the electrical outputs 34 of the photodetectors 32. The amplifiers 35 amplify the electrical signals generated by each of the photodetectors 32. The amplifiers 35 may have a resistive input impedance. Alternatively, the electrical output 34 of each of the photodetectors 32 can be electrically connected to ground through a resistor (not shown) and the voltage across the resistor can be amplified by voltage amplifiers. A charge comparator 36 compares the electrical signals generated by each of the photodetectors 32 to a reference signal supplied by a reference signal generator. The charge comparators 36 may be any of numerous charge comparators known in the art. For example, the charge comparators 36 may include a charge-to-voltage converter (not shown) such as a parallel combination of a capacitance and a switch. The charge-to-voltage converter may also include a transimpedance amplifier and a switch. In one embodiment, the laser 12 is a pulsed laser and each of the charge comparators 36 is externally set with the clock 28. The clock 28 is phase locked to the laser drive circuit 30.

The electrical output 34 of a respective photodetector 32 is connected to a first input 38 of a respective charge comparator 36. A reference signal generator 40 is connected to a second input 42 of each of the charge comparators 36. In one embodiment, the reference signal applied to each of the second inputs 42 of the charge comparators 36 is substantially the same. In another embodiment, the reference signal applied to each of the second inputs 42 of the charge comparators 36 may be different for each charge comparator 36 in order to compensate for errors in the A/D converter 10.

An output 44 of the charge comparators 36 is a one bit digital representation of the analog modulation signal. A digital error correcting circuit 46 may be electrically coupled to the output 44 of each of the charge comparators 36. The error correcting circuit 46 may poll the outputs 44 of the charge comparators 36 to determine if the outputs 44 are consistent. In addition, an encoding circuit 48 may be electrically coupled to the output 44 of each of the charge comparators 36. The encoding circuit 48 transforms the digital representation of the incident light beam into a particular digital code.

The present invention also includes a method of converting an analog signal to a digital signal using the ultra-fast electrooptical A/D converter of FIG. 1. The method includes modulating an incident light beam with an electrical modulation signal to generate a modulated light beam. The intensity of the modulated light beam may comprise a periodic function of the modulation signal. The modulated light beam is demultiplexed to generate a plurality of demultiplexed modulated light beams.

A plurality of electrical signals is generated where an amplitude of a respective one of the plurality of electrical signals is proportional to an intensity of a respective one of the plurality of demultiplexed modulated light beams. The amplitude of each of the plurality of electrical signals is then compared to an amplitude of a threshold signal. The amplitude of the threshold signal may be the same for each of the comparisons or may be different in order to compensate for errors.

The result of the comparison is a digital representation of the incident light beam. The digital representation of the incident light beam may be corrected for errors. Also, the digital representation of the incident light beam may be transformed into a different digital code.

Figure 2:
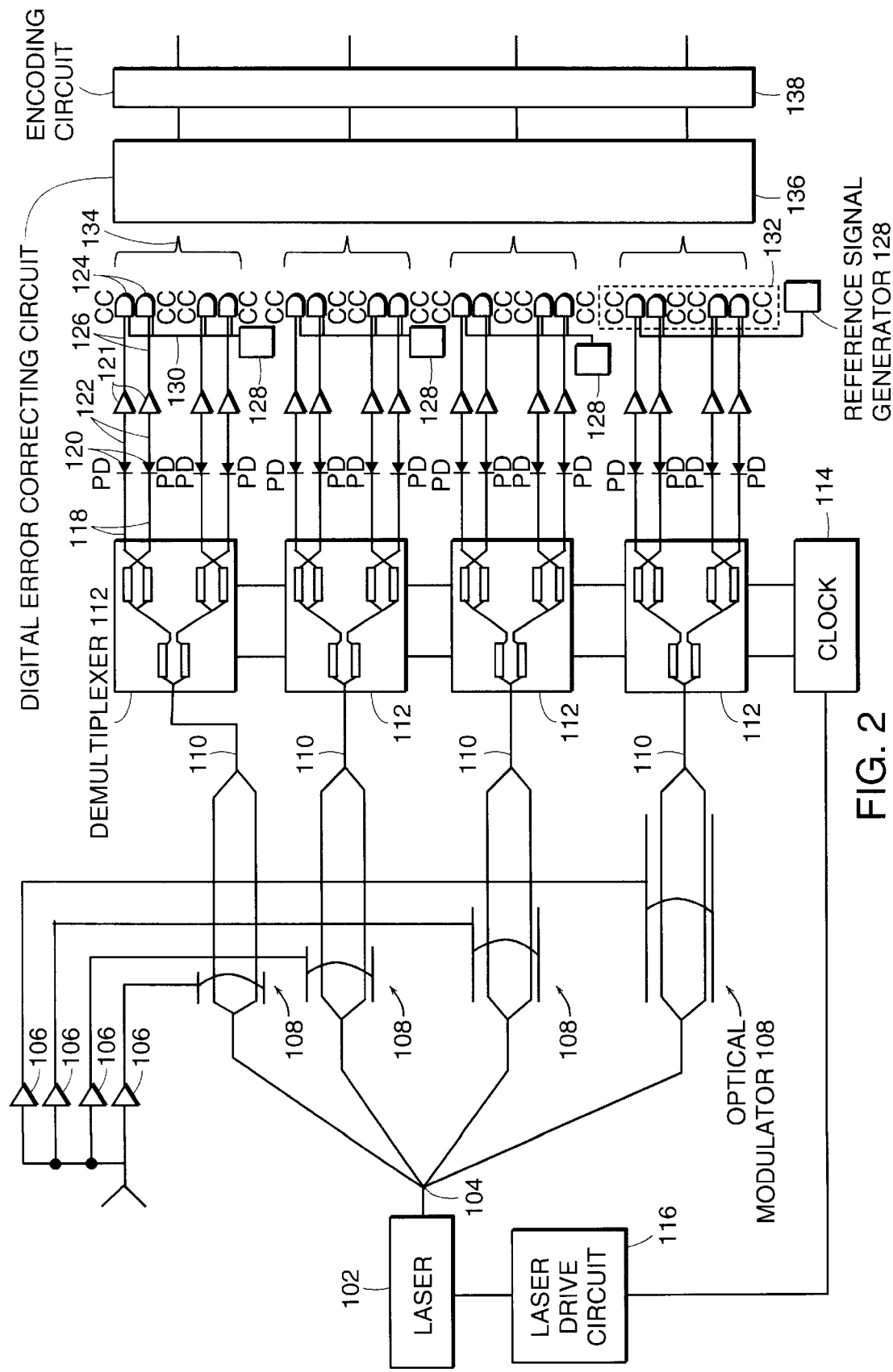
FIG. 2 is a multibit ultra-fast electrooptical analog-to-digital converter embodying the invention.

FIG. 2 is a multibit ultra-fast electrooptical analog-to-digital converter 100 embodying the invention. A laser 102 generates a CW or a pulsed beam of light. The laser 102 may be a mode-locked diode laser that generates a pulsed beam of light. A beam splitter 104 splits the beam of light into a plurality of beams of light, one beam for each bit of the A/D converter.

A plurality of electronic amplifiers 106, one amplifier for each bit of the A/D converter, provides gain to an analog electronic modulation signal. Each of the plurality of electronic amplifiers 106 have adjustable gain that may be controlled independently. The plurality of electronic amplifiers produce a plurality of modulation signals where each modulation signal has a predetermined gain.

A plurality of optical modulators 108 intensity modulate the light beam with the modulation signal. Each of the plurality of optical modulators 108 receives one of the plurality of beams of light and one of the plurality of analog electronic modulation signals having a predetermined gain and generates an intensity modulation signal at an output 110. In one embodiment, the output 110 of each of the plurality of optical modulators 108 varies periodically as a function of an applied voltage.

The overall gain of the optical modulators 108 may be successively scaled by a factor of two. In one embodiment, the intrinsic gain of each of the plurality of optical modulators 108 is successively scaled by a factor of two and the gain of the electronic amplifiers 106 is substantially the same. In another embodiment, the gain of the electronic amplifiers 106 is successively scaled by a factor of two and the intrinsic gain of the modulators 108 is substantially the same. The gain of the electronic amplifiers 106 may be adjusted to achieve the desired overall gain for each modulator 108.

A plurality of demultiplexers 112 may be optically coupled to the outputs 110 of the modulators 108. A respective one of the plurality of demultiplexers 112 receives an intensity modulated light beam from a respective one of the optical modulators 108 and demultiplexes the light beam into N channels 118 of light beams. FIG. 2 illustrates four channels. Each of the plurality of demultiplexers 112 is controlled by a clock 114 that may operate synchronously with the laser 102. The clock 114 may be derived from a laser drive circuit 116.

In one embodiment, each demultiplexer 112 directs each pulse generated by the laser 102 into a single output channel selected from the N channels 118. The repetition rate of the demultiplexed pulses is 1/N of the repetition rate of the laser. Thus, the demultiplexers 112 reduce the repetition rate of the pulses by a factor of 1/N. In operation, the repetition rate of the demultiplexed pulses is chosen such that electronic devices can be used to process the pulses.

One of a plurality of photodetectors 120 is optically coupled to each of the N channels of each demultiplexer 112. Each of a respective one of the plurality of photodetectors 120 generates an electrical signal at an electrical output 122 that is proportional to the amplitude of the demultiplexed optical pulses traveling on a respective one of the N channels. In one embodiment, the laser 102 is a CW laser and electronic amplifiers 121 are electrically coupled to each of the electrical outputs 122 of the photodetectors 120 to amplify the electrical signal generated by the photodetectors 32. A charge comparator 124 compares the electrical signals generated by each of the photodetectors 120 to a reference signal. The electrical output 122 of a respective photodetector 120 is connected to a first input 126 of a respective charge comparator 124. A reference signal generator 128 is connected to a second input 130 of each of the charge comparators 124. In one embodiment, the reference signal generators 128 may generate substantially the same reference signal for each of the charge comparator 124. In an alternative embodiment, the reference signal generators 128 generate the same reference signal for each charge comparator 124 in a group of charge comparators 132 that are coupled to one of the N channels of a particular optical modulator 108. Using different reference signals for each of the groups 132 corrects for errors in the A/D converter.

The charge comparators 124 may be any of numerous charge comparators 124 known in the art. For example, the charge comparator 124 may include a charge-to-voltage converter (not shown) such as a parallel combination of a capacitance and a switch. The charge-to-voltage converter 124 may also include a transimpedance amplifier and a switch. In one embodiment, the laser 102 is a pulsed laser and each of the charge comparators 124 is externally set with the clock 114 and the clock 114 is phase locked to the laser drive circuit 116.

The output 134 of the charge comparators 124 is a multibit digital representation of the analog modulation signal. A digital error correcting circuit 136 may be electrically coupled to the output of each of the charge comparators 124. The error correcting circuit 136 may poll the outputs of the charge comparators 124 to determine if the outputs are consistent. In addition, an encoding circuit 138 may also be electrically coupled to the output of the charge comparators 124. The encoding circuit 138 transforms the digital representation of the incident light beam into a particular digital code.

The ultra-fast electro optical A/D converter of the present invention is relatively simple and easy to manufacture. The present invention does not require the use of linear electro optic modulators with precise gain. The electronic amplifiers 106 can be used to compensate for nonlinearities in the electro optic modulators and for imprecision in the modulator's gain. The components of the A/D converter of the present invention are relatively simple. No complex electronic A/D converters are required. A comparator may be constructed from a relatively small number of transistors.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An analog-to-digital converter comprising:
   a) two or more electrooptic modulators, each modulator having an optical input adapted to receive an incident light beam and an electrical modulation input, each of the two or more electrooptic modulators generating a modulated light beam from an incident light beam in response to a modulation signal applied to the electrical modulation input;
   b) two or more optical demultiplexers, each of the two or more optical demultiplexers having an optical input and a plurality of optical outputs, a respective one of the two or more optical demultiplexers being positioned to receive a modulated light beam from a respective one of the two or more electrooptic modulators, each two or more optical demultiplexers generating a plurality of demultiplexed modulated light beams;
   c) a plurality of photodetectors, each photodetector having an optical input and an electrical output, wherein the optical input of a respective one of the plurality of photodetectors is optically coupled to a respective one of the plurality of demultiplexed modulated light beams, each of the plurality of photodetectors generating an electrical signal at its electrical output in response to an intensity of the demultiplexed modulated light beam that is coupled to its optical input; and
   d) a plurality of charge comparators, each charge comparator having a first input electrically coupled to a threshold signal source and a second input, the second input of each of a respective one of the plurality of charge comparators being electrically coupled to the electrical output of each of a respective one of the plurality of photodetectors, wherein the plurality of charge comparators generates a digital representation of the incident light beam.

2. The analog-to-digital converter of claim 1 wherein the plurality of charge comparators comprise charge-to-voltage converters.

3. The analog-to-digital converter of claim 2 wherein each of the charge-to-voltage converters comprise a parallel combination of a capacitance and a switch.

4. The analog-to-digital converter of claim 2 wherein each of the charge-to-voltage converters comprise a transimpedance amplifier and a switch.

5. The analog-to-digital converter of claim 1 wherein the incident light beam comprises continuous wave laser light.

6. The analog-to-digital converter of claim 1 wherein the incident light beam comprises pulsed laser light.

7. The analog-to-digital converter of claim 6 wherein a demultiplexing rate is substantially equal to a repetition rate of the pulsed light beam.

8. The analog-to-digital converter of claim 1 wherein an intensity of at least one of the modulated light beams comprises a periodic function of the modulation signal.

9. The analog-to-digital converter of claim 1 further comprising a digital error correcting circuit electrically coupled to the output of each of the plurality of charge comparators.

10. The analog-to-digital converter of claim 1 further comprising an encoding circuit electrically coupled to the output of each of the plurality of charge comparators, the encoding circuit transforming the digital representation of the incident light beam into a digital code.

11. The analog-to-digital converter of claim 1 wherein the threshold signal source electrically coupled to the first input of each of the plurality of charge comparators generates substantially the same signal for each of the plurality of charge comparators.

12. The analog-to-digital converter of claim 1 wherein each of the two or more electrooptic modulators generates a modulated light beam having an intensity that is substantially different from the intensity of each of the other two or more electrooptic modulators by a factor of two.

13. The analog-to-digital converter of claim 1 further comprising two or more amplifiers, a respective one of the two or more amplifiers being coupled to a respective one of the electrical modulation inputs of the two or more electrooptic modulators, each of the two or more amplifiers providing an amplified electrical modulation signal having the predetermined gain.

14. The analog-to-digital converter of claim 13 wherein the predetermined gain of each of the two or more amplifiers is substantially different from the predetermined gain of each the other two or more amplifiers by a factor of two.

15. The analog-to-digital converter of claim 1 wherein the incident light beam is substantially the same incident light beam for each of the two or more electrooptic modulators.

16. A method of converting an analog signal to a digital signal, the method comprising:
a) modulating an incident light beam with two or more electrical modulation signals to generate two or more modulated light beams;
b) demultiplexing each of the two or more modulated light beams to generate a corresponding two or more demultiplexed modulated light beams;
c) generating two or more electrical signals, each of the two or more electrical signals corresponding to a respective one of the two or more demultiplexed modulated light beams and wherein an amplitude of a respective one of the two or more electrical signals is proportional to an intensity of the corresponding demultiplexed modulated light beam; and
d) comparing the amplitude of each of the two or more electrical signals to an amplitude of a threshold signal to thereby generate a digital representation of the incident light beam.

17. The method of claim 16 wherein an intensity of each of the two or more modulated light beams comprises a periodic function of each of the two or more modulation signals.

18. The method of claim 16 further comprising the step of correcting the digital representation of the incident light beam for errors.

19. The method of claim 16 further comprising the step of transforming the digital representation of the incident light beam into a different digital code.

20. The method of claim 16 wherein the step of comparing the amplitude of each of the two or more electrical signals to an amplitude of a threshold signal comprises comparing an amplitude of each of the two or more electrical signals to the same threshold signal.

* * * * *